Oct. 8, 1963 M. P. LEPSELTER 3,106,489

SEMICONDUCTOR DEVICE FABRICATION

Filed Dec. 9, 1960

INVENTOR
M. P. LEPSELTER
BY H. W. Lockhart
ATTORNEY

United States Patent Office 3,106,489

Patented Oct. 8, 1963

3,106,489

SEMICONDUCTOR DEVICE FABRICATION

Martin P. Lepselter, New Providence, N.J., assignor to Bell Telephone Laboratories, Incorporated, New York, N.Y., a corporation of New York Filed Dec. 9, 1960, Ser. No. 74,872
5 Claims. (Cl. 117—217)

Figure 1:
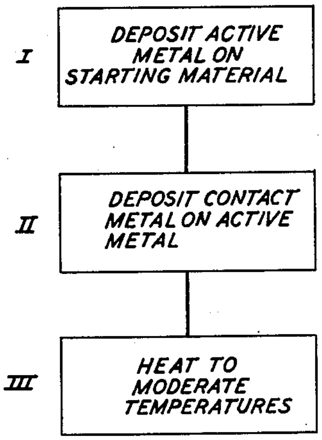

This invention relates to semiconductor devices and to methods for their fabrication.

In the fabrication of semiconductor devices it is important to provide the semiconductor wafer or body with an electrode connection thereto which is permanent and sturdy mechanically and of low resistance electrically. Permanence and sturdiness of the connection are important for long life; low resistance is important to minimize resistance losses which limit the power output and efficiency of the devices.

Achieving such a connection is a continuing problem in the semiconductor art. For example, in the fabrication of diffused semiconductor devices, the surface of the semiconductor starting wafer is, necessarily, highly polished to insure uniform diffusion. Providing an adequate connection to the polished surface, however, is a difficult problem. First, a polished surface does not wet easily and, second, mechanical adhesion to such a surface is relatively poor.

Alloyed techniques, employing wetting agents, are commonly employed to provide connections to such polished surfaces. However, the alloying usually does not occur uniformly over the semiconductor surface resulting in relatively deep penetration into portions of the surface. Such deep penetration often shorts out the shallow, diffused surface regions. Moreover, alloying techniques usually tend to result in small area, high resistance connections, a result avoided only at appreciable expense. Accordingly, relatively complicated and expensive techniques are required to achieve connections of desirable characteristics.

An object of this invention is to facilitate the making of large area, low resistance, mechanically sturdy, substantially non-penetrating connections to the surface of semiconductor wafers.

The invention is based on the discovery that a low resistance connection to a semiconductor wafer can be made without penetrating into the wafer by forming an oxide coating over the surface where the connection is desired, depositing over the oxide coating a layer of an appropriately reactive metal capable of being oxidized into an oxide soluble in the active metal, restricting the available oxygen to that supplied by the underlying oxide coating and subsequently heating the wafer to a temperature and for a time such that the original oxide layer is reduced to a negligible thickness.

In a preferred embodiment of this invention, a silicon wafer including a shallow, diffused surface region, such as is characteristic of a silicon solar cell, is contacted electrically by evaporating a relatively thin continuous layer of elemental titanium onto the silicon dioxide coating grown naturally on the exposed surfaces of such wafers, thus turning to account the oxide coating which is typically removed in prior art methods. Thin films of elemental metals which are sufficiently thick to be continuous, in the absence of special processing, usually are opaque also. This step then is followed by the evaporation of a relatively thick opaque layer of silver on said titanium layer. Subsequently, the temperature of the structure is raised to promote the oxidation to titanium oxide of the elemental titanium layer. The naturally grown silicon dioxide coating refers to the oxide coating naturally formed when a silicon surface is exposed to air at room temperature.

Accordingly, one feature of this invention is the deposition of a continuous layer of an active metal such as titanium onto the oxide coating such as silicon dioxide coating grown on the surfaces of silicon semiconductor wafers.

Figure 2:
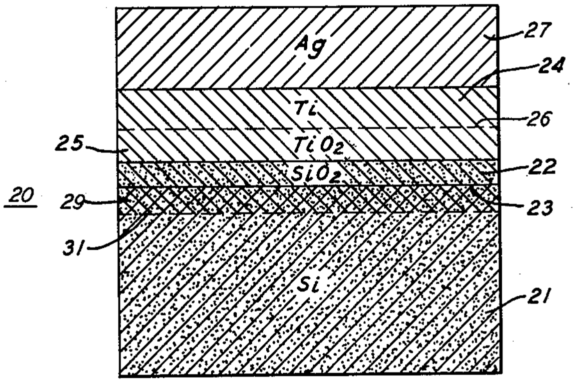

Further objects and features of this invention will be understood more clearly from the following detailed description rendered in connection with the following drawing wherein:

FIG. 1 is a block diagram illustrating the steps of the method in accordance with this invention; and FIG. 2 is a cross section of a semiconductor device fabricated in accordance with the method of FIG. 1.

For clarity of description, the dimensions of the device of FIG. 2 are not necessarily to scale. As is well known in the art, a silicon wafer acquires a thin coating of silicon dioxide when exposed to air. This coating is usually about 20 Angstrom units thick and rarely exceeds 50 Angstrom units. A surface of a silicon wafer covered with such a silicon dioxide coating is a suitable starting material for the practice of the method of this invention.

Referring now specifically to FIG. 1, as represented in block I of the flow diagram, a layer of active metal is then deposited on the oxide-coated surface of the silicon wafer. The active metal is selected from the group consisting of titanium, zirconium, niobium, tantalum, thorium and vanadium. All of these metals, with the exception of tantalum, are deposited advantageously by evaporation techniques, one suitable evaporation technique being described in Patent 2,629,672, issued February 24, 1953, to M. Sparks. Tantalum, however, is sputtered because the temperatures required to vaporize it in an evaporation chamber also cause a rapid deterioration of the tungsten coil typical of such a chamber. A suitable sputtering technique is described in Patent 2,219,611, issued October 29, 1950, to B. Berghaus.

The amount of active metal deposited by either technique is controllable as is well known in the art. The thickness of the active metal film, however, is advantageously made thicker than the underlying silicon dioxide coating. More specifically, sufficient active metal is deposited so that substantially all of the oxygen in the underlying silicon dioxide layer can be taken up in the subsequent oxidation of the active metal. Typically, the active metal film is more than five times as thick as the silicon dioxide coating. This procedure insures, first, that the amount of active metal oxide produced is insufficient to deleteriously affect the electrical properties of the connection, and, second, that there is made either an intimate connection between the active metal and the silicon substrate, as is usually preferred, or a separation between the active metal and the silicon so small that for very low applied voltages quantum-mechanical tunneling occurs across the intervening silicon dioxide layer so that its resistance is negligible.

In order to prevent the active metal in this system from combining with the oxygen in the air during the subsequent heating step, a relatively thick layer of a contact metal, such as silver or platinum, is deposited by the above evaporation or sputtering techniques immediately after deposition of the active metal. Such a deposition is indicated in block II of the figure. The structure resulting from the above steps now comprises in intimate relation distinct layers of silicon dioxide, active metal and contact metal in succession on the surface of the silicon wafer.

As indicated in block III, this structure is now subjected to the heating step. When the structure is heated, typically in air, to a temperature well below the melting point of any of the materials or eutectics in the system but typically above 200 degrees centigrade, the active metal layer converts, one atomic layer after another, to an oxide of the active metal in a time depending on the temperature and the thickness of the oxide. Typically, from three to ten minutes is necessary for the thickness of a naturally grown oxide coating.

The resulting structure 20 is depicted in cross section in FIG. 2. The silicon wafer 21 is usually encrusted in a silicon dioxide coating 22, which for simplicity is shown restricted to the surface 23 of the wafer. In the embodiment depicted, the oxide coating is not completely used in converting a portion of the titanium layer 24 into the titanium oxide layer 25 which appears to have the formula $TiO_2$. Presumably, the original layers of silicon dioxide and titanium form, in the presence of heat, thinner layers of silicon oxide and titanium oxide and titanium, respectively. However, the titanium oxide goes into solid solution with the titanium allowing, effectively, direct metal to semiconductor contact. In the figure, titanium layer 24 and titanium oxide layer 25 are shown separated by line 26, which is dashed to indicate the subsequent formation of the solid solution. The entire contact structure is capped by a layer 27 of silver to avoid the reaction between air and the titanium as indicated above.

Typically, the silicon substrate includes a shallow surface region 29 which defines with the bulk portion of the wafer a large area PN junction 31. This junction is formed by diffusion techniques which normally results in a glass coating over the silicon substrate. This glass coating is removed, advantageously, before the formation of the oxide coating.

The heating step in accordance with this invention is not necessarily carried out in air. Alternatively, the heating step can be carried out in a reducing or an inert atmosphere or in a vacuum. In these instances, several contact metals, other than those described above, such as gold, palladium, rhodium, copper and nickel also can be used to coat the active metal layer. By either alternative heating step, however, the available oxygen is restricted to that supplied by the silicon dioxide layer and the contact characteristics, accordingly, are both controllable and reproducible.

Certain advantages can result from the method of this invention when there is provided a silicon dioxide coating whose thickness is greater than that which naturally occurs. Typically, such a coating is grown by a thermal technique to a thickness of 5,000 to 10,000 Angstrom units such as is required to inhibit the diffusion of significant impurities into the surface of the underlying semiconductor material from a surrounding vapor. A technique for growing such a coating is disclosed in Patent 2,930,722, issued March 29, 1960, to J. R. Ligenza. For example, zirconium can be deposited on a thick oxide coating in accordance with a prescribed pattern, coated with a layer of rhodium and heated to selectively react the zirconium with the silicon dioxide coating. Subsequent exposure to a vapor of a significant impurity would allow diffusion into the silicon substrate only where the zirconium reacted selectively with the silicon dioxide, the remainder of the silicon dioxide coating acting as a diffusion mask. In this instance, the thickness of the zirconium is typically thicker than the grown oxide coating. Such a use of the silicon dioxide coating is described in detail in Patent 2,873,222, issued February 10, 1959, to L. Derick and C. J. Frosch.

The method of this invention was practiced on a silicon wafer having dimensions .250 x .250 x .010 inch. The wafer included a bulk portion of P-type conductivity having a resistivity of 20 ohm-centimeters (including a uniform concentration of boron) and a surface portion of N-type conductivity (including a concentration of phosphorus decreasing from a surface concentration of $10^{20}$ atoms per cubic centimeter) defining a shallow, diffused, broad area PN junction about .00003 inch from one surface of the wafer (31 of FIG. 2). This surface of the wafer was cleaned by well known post diffusion etching techniques to remove residual glass layers formed during the diffusion step. The thus cleaned wafer surface then was exposed to air at room temperature to form an oxide coating about 20 Angstrom units thick. A layer of titanium 1,000 Angstrom units thick and .250 x .050 inch in area was evaporated onto the surface portion of the wafer. The evaporation was carried out in a standard evaporation chamber at a pressure of $1 \times 10^{-5}$ millimeters of mercury by heating to a temperature of about 2500 degrees centigrade for about five minutes a titanium source positioned in the helical tungsten filament typical of evaporation chambers. A layer of silver 10,000 Angstrom units thick then was deposited on top of the titanium layer, without breaking the vacuum of the above system, by raising the temperature of a source of silver positioned in a second helical tungsten filament to a temperature of 2500 degrees centigrade for about five minutes. Subsequently, the lamellate structure was removed from the evaporation chamber and heated to approximately 600 degrees centigrade for two minutes. The other contact, in this particular embodiment connected to the P-type conductivity bulk portion of the wafer, was a standard silver-aluminum eutectic alloy contact.

The alternating current resistance measured less than one ohm at 100 milliamperes direct current bias for 20-ohm centimeter resistivity material, which indicates that the contact exhibits negligible resistance.

No effort has been made to exhaust the possible embodiments of the invention. It will be understood that the embodiments described are merely illustrative of the preferred form of the invention and various modifications may be made therein without departing from the spirit and scope of the invention.

For example, it should be evident to one skilled in the art that although this invention has been described in terms of silicon semiconductor material, it is adaptable to other oxide-forming semiconductor materials such as germanium and gallium arsenide.

What is claimed is:

1. A method for fabricating a substantially non-penetrating contact to a slice of semiconductor material which includes an oxide coating, comprising depositing a layer of an active metal selected from the group consisting of titanium, zirconium, niobium, tantalum, thorium and vanadium on said oxide coating, depositing over the layer of active metal a layer of a contact metal between about 1,500 and 10,000 Angstrom units thick selected from the group consisting of silver and platinum, gold, rhodium, copper, nickel and palladium and heating at a temperature and for a time to convert subtantially all of the underlying oxide coating to an oxide of the active metal.

2. A method for fabricating a low resistance contact to a slice of semiconductor material selected from a group consisting of germanium, silicon, and gallium arsenide, said slice including an oxide coating, comprising depositing a continuous layer of an active metal selected from the group consisting of titanium, zirconium, niobium, tantalum, thorium and vanadium on said oxide coating, depositing a continuous layer of a contact metal between about 1,500 and 10,000 Angstrom units thick-selected from the group consisting of gold, silver, palladium, rhodium, copper, nickel and platinum, and heating in a vacuum at a temperature and for a time to convert substantially all of the underlying oxide coating to an oxide of the active metal.

3. A method for fabricating a low resistance contact to a slice of silicon semiconductor material which includes an oxide coating comprising evaporating a layer of titanium on a portion of said oxide coating, evaporating a layer of silver between about 1,500 and 10,000

Angstrom units thick on said layer of titanium and heating to a temperature and for a time to convert substantially all of the underlying oxide coating to an oxide of the active metal.

4. A method for fabricating a low resistance contact to a slice of silicon semiconductor material which includes an oxide coating comprising evaporating onto at least a portion of said oxide coating a continuous layer of titanium about 1,000 Angstrom units thick, immediately evaporating onto said titanium layer a layer of silver about 10,000 Angstrom units thick, and heating to a temperature below the silver-silicon eutectic temperature for about three minutes to convert substantially all of the underlying oxide coating to an oxide of the active metal.

5. A method for fabricating a low resistance contact to a slice of silicon semiconductor material which includes an oxide coating comprising evaporating onto said oxide coating a continuous layer of titanium 1,000 Angstrom units thick, evaporating onto said titanium layer a layer of silver 10,000 Angstrom units thick, and heating to a temperature of between 200 and 600 degrees centigrade for about three minutes.

References Cited in the file of this patent

UNITED STATES PATENTS 2,799,600 Scott ------------------ July 16, 1957